US012696808B1

(12) United States Patent
Gregory, Jr. et al.

(10) Patent No.: US 12,696,808 B1
(45) Date of Patent: Jul. 28, 2026

(54) CARRIER DIE WITH MICRO CHANNEL COOLING AND EMBEDDED COMPONENTS

(71) Applicant: MARVELL ASIA PTE LTD, Singapore (SG)

(72) Inventors: John E. Gregory, Jr., Dummerston, VT (US); Eva Shah Holmes, Wappingers Falls, NY (US); Carlos Macian Ruiz, Los Gatos, CA (US); Mark William Kuemerle, Essex Junction, VT (US); Wolfgang Sauter, Burke, VT (US); Aatreya Chakravarti, Willston, VT (US); Samer Michael Akiki, Burlington, VT (US)

(73) Assignee: MARVELL ASIA PTE LTD, Singapore (SG)

( * ) Notice: Subject to any disclaimer, the term of this patent is extended or adjusted under 35 U.S.C. 154(b) by 527 days.

(21) Appl. No.: 18/201,443

(22) Filed: May 24, 2023

Related U.S. Application Data

(60) Provisional application No. 63/345,476, filed on May 25, 2022.

(51) Int. Cl.
| | |
|---|---|
| *H10W 90/00* | (2026.01) |
| *H10W 40/43* | (2026.01) |
| *H10W 40/47* | (2026.01) |
| *H10W 90/20* | (2026.01) |

(52) U.S. Cl.
CPC ........... *H10W 90/00* (2026.01); *H10W 40/43* (2026.01); *H10W 40/47* (2026.01); *H10W 90/288* (2026.01); *H10W 90/722* (2026.01)

(58) Field of Classification Search
CPC ... H01L 23/467; H01L 25/0657; H01L 25/50; H10W 90/00; H10W 40/47; H10W 40/43
See application file for complete search history.

(56) References Cited

U.S. PATENT DOCUMENTS

| | | | | |
|---|---|---|---|---|
| 6,218,784 | B1 * | 4/2001 | Jang | H01J 11/34 |
| | | | | 313/268 |
| 7,358,201 | B2 * | 4/2008 | Ramanathan | H10W 40/47 |
| | | | | 257/E23.098 |
| 10,615,133 | B2 * | 4/2020 | Kamgaing | H01L 25/50 |
| 2018/0211900 | A1 * | 7/2018 | Gutala | H10W 40/47 |
| 2021/0280497 | A1 * | 9/2021 | Brun | H01L 23/053 |

OTHER PUBLICATIONS

AMD: "AMD at Computer 2021"; May 31, 2021, https://www.youtube.com/watch?v=gqAYMx34euU.
Brunschwiler, Thomas: "Functional Electronic Packagin: Thermal management roadmap;" IBM Research, Scient and Technology, Zurich, Switzerland; Accenssed May 2023; https://www.zurich.ibm.com/st/electronicpackaging/cooling.html#ibm-content.

(Continued)

*Primary Examiner* — Dale E Page
*Assistant Examiner* — Wilner Jean Baptiste

(57) ABSTRACT

A three-dimensional (3D) integrated circuit (IC) includes a plurality of dies, a carrier die, and a plurality of channels embedded in the carrier die. The plurality of dies is stacked in the 3D IC. Each of the dies includes circuitry. The carrier die is disposed above the stacked dies in the 3D IC. The carrier die is configured to provide mechanical support to the stacked dies in the 3D IC. The plurality of channels is configured to carry a coolant to cool the 3D IC.

28 Claims, 13 Drawing Sheets

(56) References Cited

OTHER PUBLICATIONS

Corintis: "Unlocking A New Dimension in Cooling": 2021. https://www.corintis.com/.
Moore, Samuel K., "Graphcore Uses TSMC 3D Chip Tech to Speed AI by 40% Unveils plan for $120-million "brain-scale" supercomputers in 2024"; IEEE Spectrum for the Technology Insider, Mar. 3, 2022.

* cited by examiner

CARRIER DIE WITH MICRO CHANNEL COOLING AND EMBEDDED COMPONENTS

CROSS-REFERENCE TO RELATED APPLICATIONS

This application claims the benefit of U.S. Provisional Application No. 63/345,476, filed on May 25, 2022. The entire disclosure of the application referenced above is incorporated herein by reference.

FIELD

The present disclosure relates generally to integrated circuits and more particularly to utilizing a carrier die used in integrated circuits to provide microchannels for cooling the integrated circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Integrated circuits such as processors and memories are typically manufactured in the form of dies. For example, a die comprises millions of active electrical components such as transistors, as well as passive electrical components such as resistors, manufactured on a silicon substrate. The dies are then mounted on printed circuit boards, which are used in devices such as computers, handheld devices, and network devices.

To make these devices compact, the dies are often stacked vertically on top of each other to form three-dimensional (3D) integrated circuits (ICs). For example, one or more dies comprising memory can be stacked on top of a die comprising a processor. The stacked dies are interconnected using various connecting mechanisms such as bond pads, ball grid arrays (BGAs), bond wires, and through silicon vias (TSVs). A carrier die, which is simply a silicon substrate without any electrical components, is disposed on top of the stack of dies to provide mechanical support to the stacked dies in the 3D ICs.

SUMMARY

A three-dimensional (3D) integrated circuit (IC) comprises a plurality of dies, a carrier die, and a plurality of channels embedded in the carrier die. The plurality of dies is stacked in the 3D IC. Each of the dies comprises circuitry. The carrier die is disposed above the stacked dies in the 3D IC. The carrier die is configured to provide mechanical support to the stacked dies in the 3D IC. The plurality of channels is configured to carry a coolant to cool the 3D IC.

In other features, the plurality of channels is configured to carry a fluid coolant in a liquid or gaseous phase to remove heat from the stacked dies in the 3D IC.

In other features, the channels in the plurality of channels are unconnected to each other.

In other features, at least two of channels in the plurality of channels are connected to each other.

In other features, the channels in the plurality of channels are distributed evenly throughout the carrier die.

In other features, the channels in the plurality of channels are configured to provide a first cooling capacity at a first spatial region of the 3D IC and a second cooling capacity, different from the first cooling capacity, at a second spatial region of the 3D IC different from the first spatial region.

In other features, the channels in the plurality of channels are distributed in one or more different patterns in the carrier die.

In other features, a system comprises the 3D IC and further comprises a coolant supply configured to supply a coolant to flow through the plurality of channels. The coolant is configured to draw heat from the stacked dies in the 3D IC.

In other features, the carrier die further comprises one or more circuits connected to one or more of the stacked dies in the 3D IC by one or more vias in the carrier die and in the one or more of the stacked dies in the 3D IC.

In other features, the one or more circuits comprise at least one of (i) passive electrical components, (ii) active electrical components, (iii) an amplifier, and (iv) a power regulator.

In other features, the passive electrical components comprise at least one of a resistor, a capacitor, and an inductor; and the active electrical components comprise at least one of a transistor and a diode.

In other features, the channels in the plurality of channels in the carrier die are disposed around the one or more circuits in the carrier die.

In other features, the plurality of channels and the one or more circuits in the carrier die are disposed in a same plane.

In other features, the plurality of channels and the one or more circuits in the carrier die are disposed in different planes.

In other features, the 3D IC further comprises a layer of silicon disposed around one of the stacked dies. At least one of the one or more circuits is connected to one or more of the stacked dies in the 3D IC by one or more vias in the carrier die, the one or more of the stacked dies in the 3D IC, and the layer of silicon.

In other features, an electronic system comprises the 3D IC and further comprises a printed circuit board (PCB) on which the 3D IC is mounted. The PCB comprises at least one circuit connected to at least one of one or more the circuits in the carrier die.

In other features, the at least one circuit on the PCB is connected to the at least one of the one or more circuits in the carrier die by vias in the carrier die, the stacked dies in the 3D IC, and the PCB.

In other features, the electronic system further comprises a layer of silicon disposed around one of the stacked dies. The at least one circuit on the PCB is connected to the at least one of the one or more circuits in the carrier die by vias in the carrier die, the stacked dies in the 3D IC, the PCB, and the layer of silicon.

In other features, the at least one circuit on the PCB comprises a first power regulator configured to regulate a first power supply configured to supply a first power to at least one of the stacked dies in the 3D IC. The at least one of the one or more circuits in the carrier die comprises a second power regulator configured to regulate a second power supply configured to supply a second power to at least one of the stacked dies in the 3D IC.

In other features, the first and second power regulators are configured to regulate different voltages.

In still other features, a method of fabricating a three-dimensional (3D) integrated circuit (IC) comprises arranging a plurality of dies comprising circuitry in a stack;

disposing a carrier die above the stacked dies to provide mechanical support to the stacked dies; embedding a plurality of channels in the carrier die; and supplying a coolant through the plurality of channels to cool the 3D IC.

In other features, the method further comprises embedding the plurality of channels in the carrier die by orthogonally disposing the plurality of channels in the carrier using at least one of drilling and etching processes.

In other features, the method further comprises providing a first cooling capacity at a first spatial region of the 3D IC and a second cooling capacity, different from the first cooling capacity, at a second spatial region of the 3D IC different from the first spatial region.

In other features, the method further comprises disposing one or more circuits in the carrier die, and connecting the one or more circuits to one or more of the stacked dies by one or more vias in the carrier die and in the one or more of the stacked dies.

In other features, the method further comprises disposing the plurality of channels in the carrier die around the one or more circuits in the carrier die.

In other features, the method further comprises arranging the plurality of channels and the one or more circuits in the carrier die in respective planes.

In other features, the method further comprises disposing a layer of silicon disposed around one of the stacked dies; and connecting at least one of the one or more circuits to one or more of the stacked dies by one or more vias in the carrier die, the one or more of the stacked dies in the 3D IC, and the layer of silicon.

In other features, the method further comprises mounting the 3D IC on a printed circuit board (PCB) comprising at least one circuit, and connecting the at least one circuit on the PCB to at least one of the one or more circuits in the carrier die.

In other features, the method further comprises disposing a layer of silicon around one of the stacked dies; and connecting the at least one circuit on the PCB to at least one of the one or more circuits in the carrier die by vias in the carrier die, the stacked dies in the 3D IC, the PCB, and the layer of silicon.

In other features, the method further comprises regulating a first power supply configured to supply a first power to at least one of the stacked dies using a first power regulator disposed in the at least one circuit on the PCB, and regulating a second power supply configured to supply a second power to at least one of the stacked dies using a second power regulator disposed in at least one of the one or more circuits in the carrier die.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
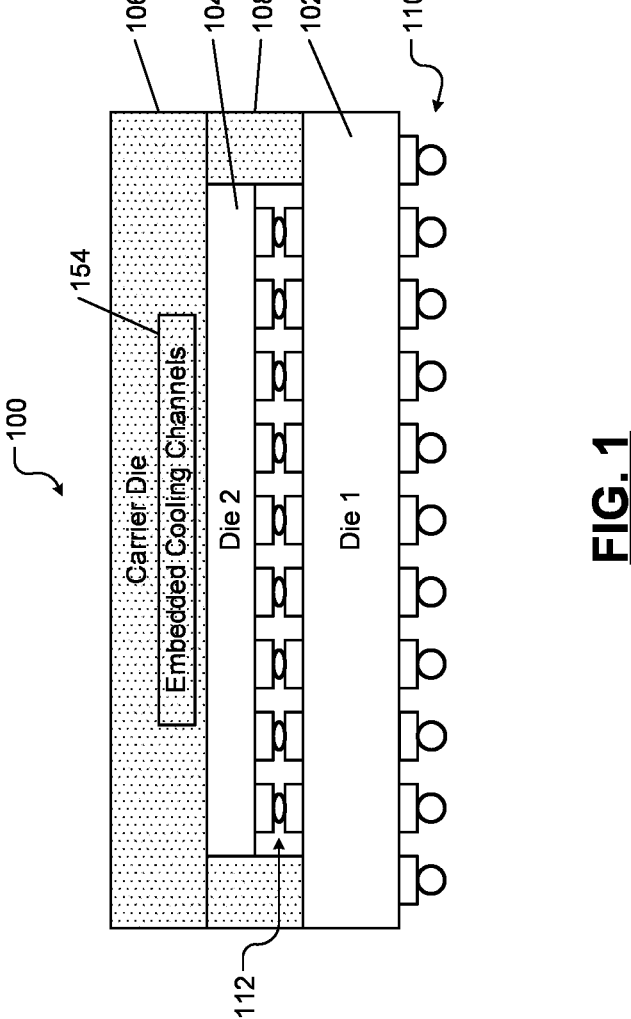
FIG. 1 shows a three-dimensional (3D) integrated circuit (IC) comprising a plurality of dies and a carrier die comprising microchannels for cooling the 3D IC.

One of the challenges with three-dimensional (3D) integrated circuits (ICs) comprising stacked dies is cooling the stacked dies in the 3D ICs. Conventionally, the 3D ICs are cooled using various cooling mechanisms. Examples of these cooling mechanisms include conductive cooling (e.g., thermally coupled heat sinks and/or external cooling channels disposed above a carrier die of the 3D IC), convective cooling (e.g., air circulated using cooling fans), and the like. However, these cooling mechanisms have drawbacks. For example, heat sinks increase the height of the 3D ICs, which diminishes the compactness achieved by the 3D ICs. Convective cooling is a weak (i.e., inefficient) heat removal mechanism, and fans used in convective cooling are prone to failure. The external cooling channels installed above the carrier die add overhead such as conduits, which require additional space.

The present disclosure provides cooling microchannels formed within the carrier die, which carrier die already exists in the 3D ICs, and which is not utilized for any purpose other than for providing mechanical support to the stacked dies in the 3D ICs. A coolant is supplied through the microchannels disposed within the carrier die. The coolant in the microchannels sinks heat from the dies in the 3D ICs more efficiently than the above-mentioned cooling mechanisms. The microchannels also do not add any overhead and space to the 3D ICs. Instead, the microchannels utilize the already existing carrier die to provide the additional benefit of cooling the 3D ICs.

Further, additional circuitry such as active and passive electrical components (resistors, capacitors, inductors, transistors, diodes, etc.), amplifiers, and power regulators can be embedded in the carrier die around the microchannels in the carrier die. The circuits embedded on the carrier die can be connected to the dies in the 3D IC as well as to a printed circuit board (PCB) on which the 3D IC and other circuits are installed. For example, the circuits embedded on the carrier die can be connected to the dies in the 3D IC using through silicon vias (TSVs) in the dies. The circuits embedded in the carrier die can be connected to the PCB using TSVs in the dies, using connections external to the 3D IC, or both.

The dies in the 3D IC and the other circuits on the PCB can use the additional circuitry disposed in the carrier die. Typically, the additional circuitry is installed on the PCB. By embedding the additional circuitry in the carrier die instead, the size of the PCB can be reduced, which in turn can increase the compactness of the devices in which the 3D ICs are used. The arrangement of the microchannels and the additional circuitry in the carrier die can be optimized to provide effective cooling for the dies in the 3D IC and to make optimal connections of the additional circuitry to the circuits in the dies of the 3D IC and to the other circuits on the PCB.

Disposing the additional circuitry in the carrier die can provide additional advantages. For example, in some applications, the other circuits on the PCB can be simplified by removing some components from the other circuits on the PCB to the carrier die. For example, a power regulator disposed in the carrier die can be connected to a power supply bus bar on the PCB to receive power from the PCB. The power regulator disposed in the carrier die can regulate power supplied to the dies in the 3D IC as well as to the other circuits on the PCB. Accordingly, in such implementations the circuits on the PCB need not additionally include a power regulator.

Further, the dies in the 3D IC and the circuits on the PCB may utilize more than one power supply (e.g., ±5V, ±12V, etc.). In an embodiment, a first power regulator disposed in the carrier die can regulate a first power supply, and a second power regulator disposed on the PCB can regulate a second power supply separate from the first power supply. Thus, power supply to the 3D IC can be controlled from the top end of the 3D IC using the circuitry disposed in the carrier die as well as from the bottom end of the 3D IC using circuitry disposed on the PCB on which the 3D IC is arranged. These and other features of the present disclosure are described below in further detail.

FIG. 1 schematically shows a cross-sectional view of an example of a 3D IC 100 comprising embedded cooling channels (also called microchannels) 154. The 3D IC 100 comprises a first die (Die 1) 102, a second die (Die 2) 104, and a carrier die 106. The second die 104 is stacked or mounted on top of the first die 102. The carrier die 106 is mounted or stacked on top of the second die 104.

For example, the second die 104 may be smaller in size than the first die 102 as shown. As used herein, the size of the dies comprises both planar dimensions such as length and width as well as height. However, in some examples, the second die 104 may be of the same size as the first die 102 or can be greater in size than the first die 102. In other examples, while not shown, the first die 102 may comprise two or more dies arranged adjacent to each other. Alternatively or additionally, the second die 104 may comprise two or more dies arranged adjacent to each other. Regardless of the sizes and number of the first and second dies 102, 104, the size of the carrier die 106 is generally equal to the size of the larger of the first and second dies 102, 104.

In the example shown, since the second die 104 is smaller than the first die 102, a block or layer of silicon 108 is disposed around a perimeter of the second die 104. The silicon block 108 fills the volume surrounding the perimeter of the second die 104 between the carrier die 106 and the first die 102. Similar to the carrier die 106, the silicon block 108 also does not contain any circuitry. Together, the carrier die 106 and the silicon block 108 provide mechanical support to the first and second dies 102, 104 in the 3D IC 100.

The first and second dies 102, 104 can be connected to each other and the 3D IC 100 can be connected to a PCB in many ways. For example, on the bottom side, the first die 102 comprises elements such as bond pads and ball grid arrays (BGAs) generally shown at 110 to connect the 3D IC 100 to a PCB (not shown). Additionally, the top side of the first die 102 and the bottom side of the second die 104 also comprise elements such as bond pads and BGAs generally shown at 112 to connect the first and second dies 102, 104 to each other.

Conventionally, the carrier die 106 is simply a silicon substrate without any electrical components and is disposed on top of the second die 104 (i.e., on top of the stack of first and second dies 102, 104) to provide mechanical support to the stacked first and second dies 102, 104 in the 3D IC 100. Further, conventionally, external cooling channels (not shown) are installed above the carrier die 106. Instead, in the present disclosure, the carrier die 106 comprises embedded cooling channels 154, which eliminate the conventionally used external cooling channels. The embedded cooling channels 154 are described below in further detail. Additionally, one or more circuits can also be embedded in the carrier die 106 along with the embedded cooling channels 154 as described below in further detail.

Figure 2:
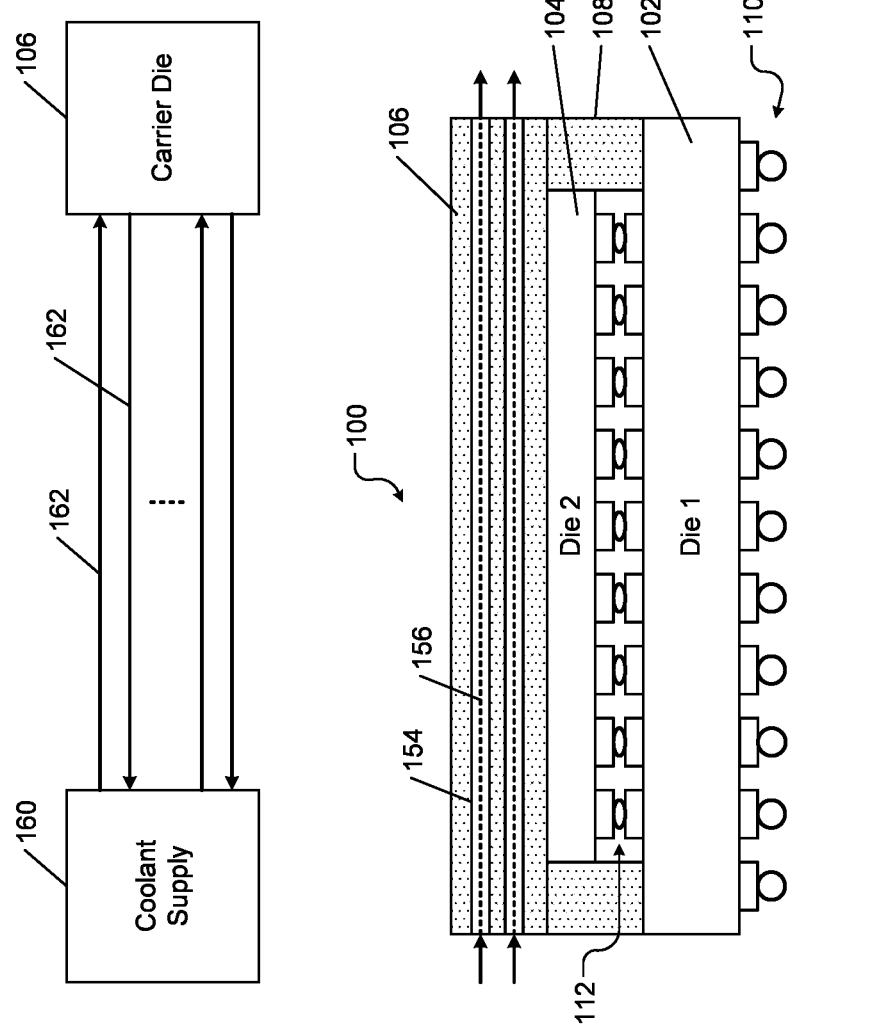
FIG. 2 shows the 3D IC of FIG. 1 comprising a plurality of dies and a carrier die comprising microchannels for cooling the 3D IC in detail.

FIG. 2 schematically shows a cross-sectional view of an example of the 3D IC 100 according to the present disclosure in further detail. Elements identified in FIG. 2 with the same reference numerals as in FIG. 1 are not described again for brevity. The carrier die 106 comprises one or more microchannels 154 drilled or otherwise formed through the carrier die 106. For example, the microchannels 154 can be drilled mechanically or using laser. Alternatively or additionally, the microchannels 154 can be formed using etching or other suitable semiconductor fabrication techniques. The microchannels 154 can be of any suitable shape. For example, the microchannels 154 can have a circular cross-section. In general, the cross-section of the microchannels 154 can be of any polygonal shape. Various non-limiting examples of arrangements of the microchannels 154 within the carrier die 106 are shown in FIGS. 3A-3D and 4A-4H.

A coolant supply 160 supplies a coolant 156 to the microchannels 154 in the carrier die 106 through conduits 162. For example, the coolant 156 can comprise a fluid in liquid or a gaseous phase. For example, the gas can be compressed by the coolant supply 160. The coolant 156 flows through the conduits 162 into the microchannels 154 in the carrier die 106. The coolant 156 can be returned to the coolant supply 160 via the conduits 162.

During operation of the 3D IC 100, the first and second dies 102, 104 generate heat. The heat generated by the first and second dies 102, 104 is transferred to the carrier die 106. The coolant 156 flowing through the microchannels 154 in the carrier die 106 conducts the heat from the carrier die 106 and flows out of the microchannels 154 in the carrier die 106. The flow of the coolant 156 through the microchannels 154 in the carrier die 106 cools the 3D IC 100.

FIGS. 3A-3D and 4A-4H schematically show various non-limiting examples of arrangements of the microchannels 154 in the carrier die 106. FIGS. 3A-3D and 4A-4H schematically show transverse sections of the carrier die 106 of the 3D IC 100 shown in FIG. 2. The coolant 156 is not shown. The configuration and layout of the microchannels 154 in the carrier die 106 may be based on patterns of heat distribution in the carrier die 106. In other words, the configuration and layout of the microchannels 154 in the carrier die 106 can be patterned based on the type of circuitry in the first and second die 102, 104. For example, in an embodiment, a denser layout of the microchannels 154 having a relatively greater cooling capacity can be disposed adjacent to regions of the 3D IC 100 which generate a greater amount of heat, while a layout of the microchannels 154 having a relatively lesser cooling capacity can be disposed adjacent to regions of the 3D IC 100 which generate a lesser amount of heat. For example, the cooling capacity of the microchannels 154 can be manipulated by modifying a density of the microchannels 154, or by modifying diameter or cross-sectional area of the microchannels 154 to accommodate a greater or lesser flow of coolant 156.

Figures 3A, 3B, 3C, 3D:
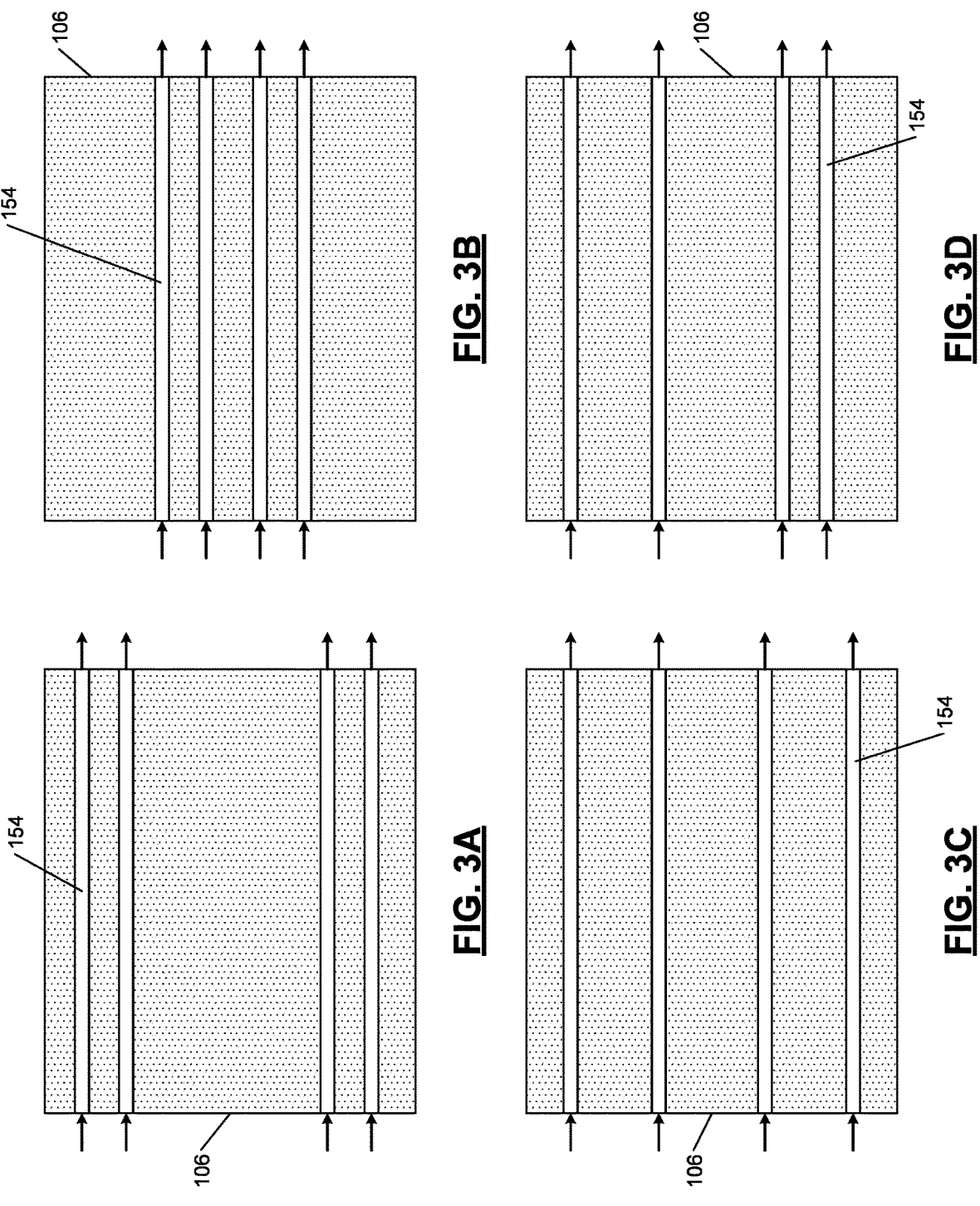
FIGS. 3A-3D and 4A-4H show various configurations of microchannels disposed in the carrier die in the 3D IC of FIG. 2.

For example, in FIG. 3A, a plurality of microchannels 154 may be disposed adjacent to two sides of the carrier die 106 with no microchannels 154 disposed in a center region of the carrier die 106. In FIG. 3B, a plurality of microchannels 154 may be disposed in the center region of the carrier die 106 with no microchannels 154 disposed adjacent to the sides of the carrier die 106. In FIG. 3C, the microchannels 154 may be distributed evenly throughout the carrier die 106. In FIG. 3D, some of the microchannels 154 may be disposed farther apart from one another in a first region of the carrier die 106 while other microchannels 154 may be disposed closer together in a second region of the carrier die 106. Many other configurations and layouts of the microchannels 154 in the carrier die 106 are possible. For example, any combination of the configurations shown in FIG. 3A-3D may be used. In the configurations and layouts shown in FIGS. 3A-3D, each microchannel 154 comprises an inlet and an outlet to flow the coolant 156 through the microchannel 154. In other words, the coolant 156 flows through each of the microchannels 154 independently of the other microchannels 154. The coolant supply 150 may independently control the flow rate of the coolant 156 through the microchannels 156.

FIGS. 4A-4H show additional non-limiting examples of configurations and layouts of the microchannels 154 in which one or more of the microchannels 154 may be connected to each other to form serpentine microchannels 154. For example, serpentine microchannels 154 can be formed using etching or other suitable semiconductor fabrication techniques. For example, in FIG. 4A, a plurality of microchannels 154 may be disposed adjacent to two sides of the carrier die 106 with no microchannels 154 disposed in the center region of the carrier die 106 similar to the configuration shown in FIG. 3A, except that in each pair of microchannels 154, the microchannels 154 are connected to each other. In each pair of connected microchannels 154, the coolant 156 flows through an inlet, flows through the pair of connected microchannels 154, and flows through an outlet.

Figures 4A, 4B, 4C, 4D:
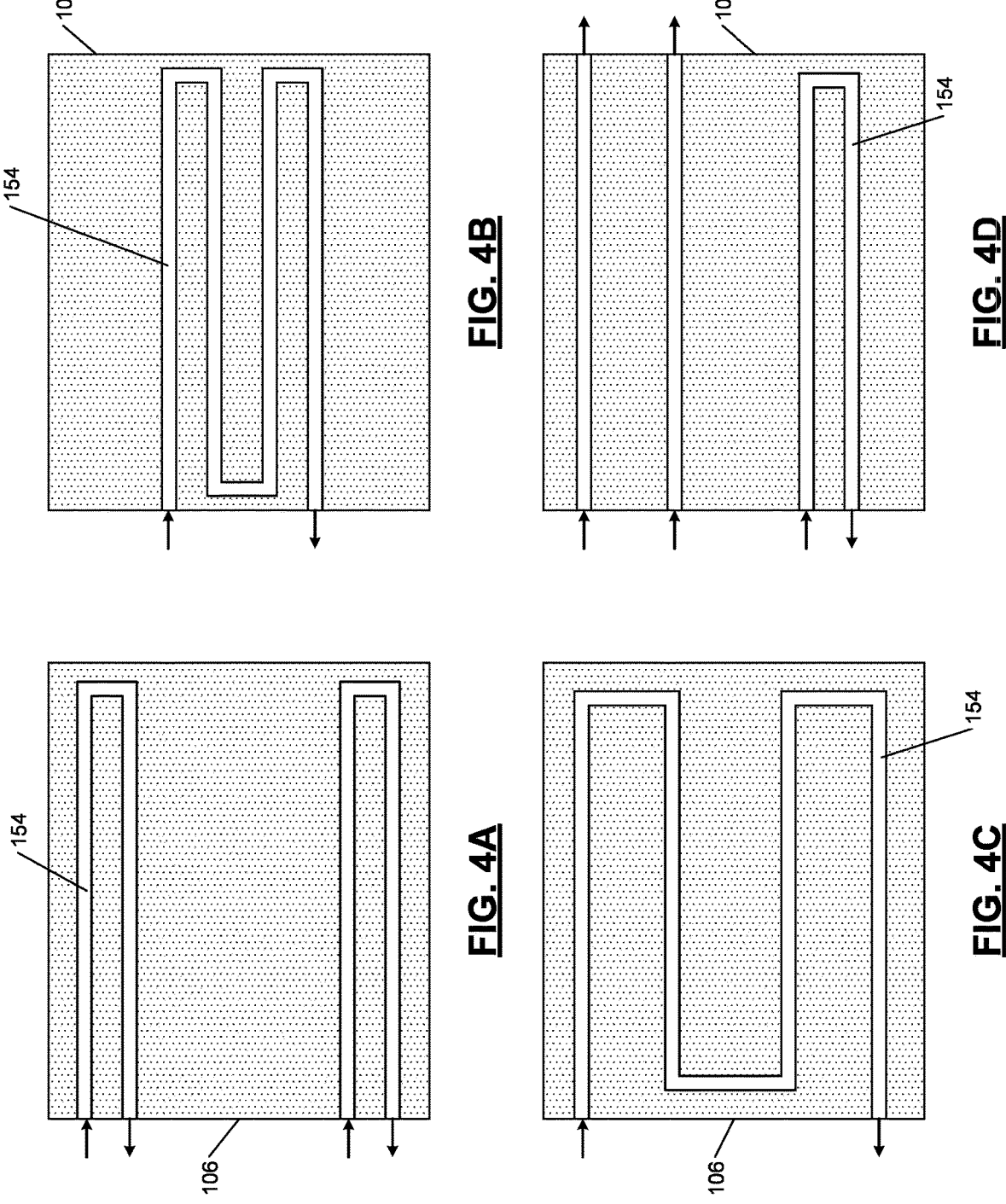

In FIG. 4B, a plurality of microchannels 154 may be disposed in the center region of the carrier die 106 with no microchannels 154 disposed adjacent to the sides of the carrier die 106 similar to the configuration shown in FIG. 3B, except that the microchannels 154 are connected to each other to form a serpentine microchannel 154. The coolant 156 flows through an inlet, flows through the serpentine microchannel 154, and flows through an outlet.

In FIG. 4C, the microchannels 154 may be distributed evenly throughout the carrier die 106 similar to the configuration shown in FIG. 3C, except that the microchannels 154 are connected to each other to form a serpentine microchannel 154. The coolant 156 flows through an inlet, flows through the serpentine microchannel 154, and flows through an outlet.

In FIG. 4D, some of the microchannels 154 may be disposed farther apart from one another in a first region of the carrier die 106 while other microchannels 154 may be disposed closer together in a second region of the carrier die 106. In the example shown, the microchannels 154 in the first region are not connected to each other while the microchannels 154 in the second region are connected to each other. Alternatively, the microchannels 154 in the first region may be connected to each other while the microchannels 154 in the second region may not be connected to each other. In still other examples, the microchannels 154 in the first and second regions may be connected to each other. Many other configurations of arranging and connecting the microchannels 154 in the carrier die 106 are possible. For example, any combination of the configurations shown in FIGS. 3A-3D and 4A-4D may be used. In the example shown, the coolant 156 may flow in and out of the unconnected microchannels 154 in the first region independently of the other microchannels 154, and the coolant 156 may flow in and out of the connected microchannels 154 as shown.

Figures 4E, 4F, 4G, 4H:
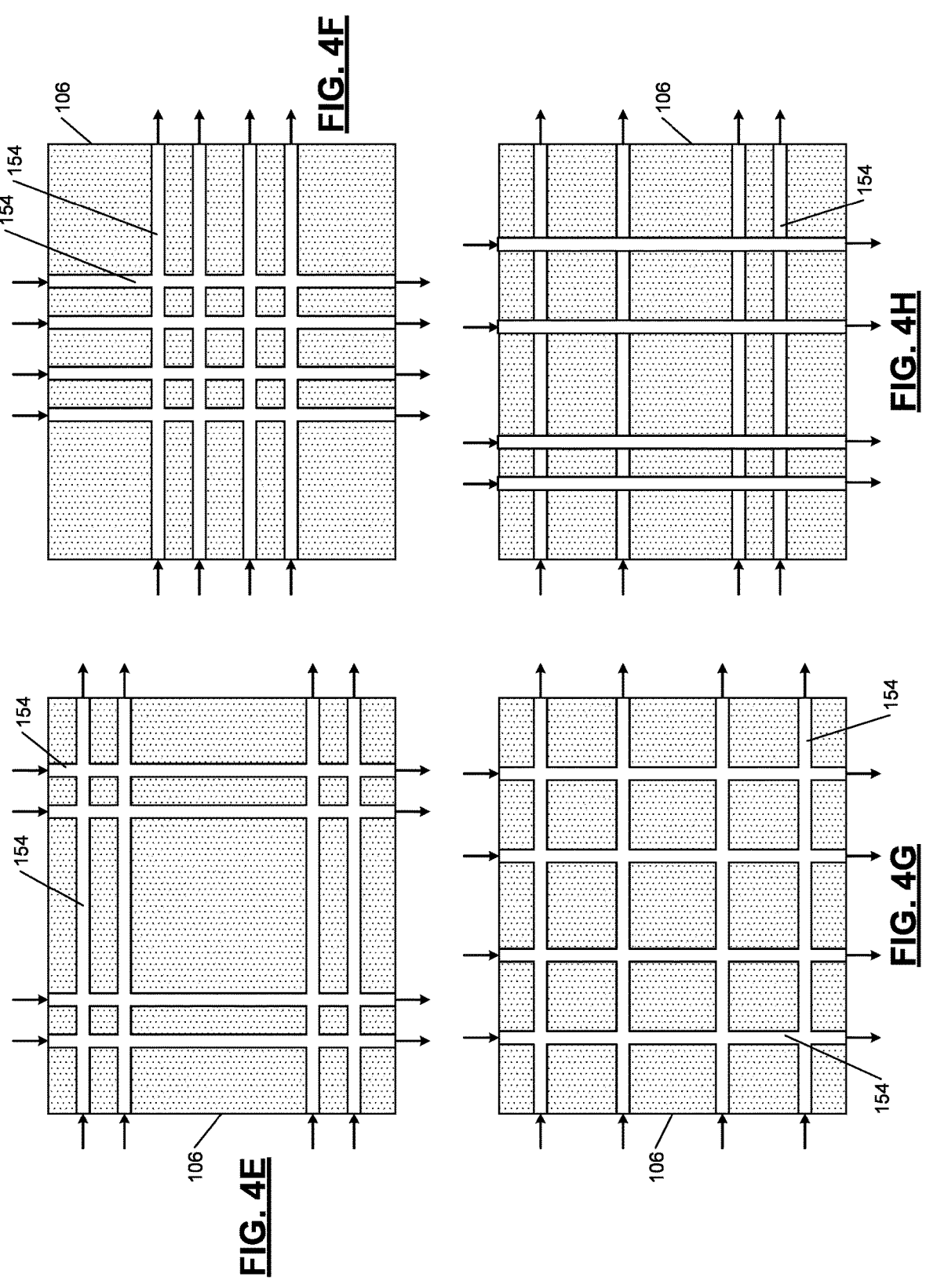

FIGS. 4E-4H show layouts of the microchannels 154 in which one or more microchannels 154 can be connected in a matrix form. For example, the microchannels 154 can be drilled (and/or etched) in the carrier die 106 orthogonally through perpendicular sides of the carrier die 106. In some examples (e.g., as shown in FIG. 4H), some of the microchannels 154 can be connected to each other in groups while not connecting the groups to each other. For example, each group of microchannels 154 can be formed in a different plane. In the grouped example, the coolant supply 150 may independently control the flow rate of the coolant 156 through different groups of microchannels 156.

Figure 5:
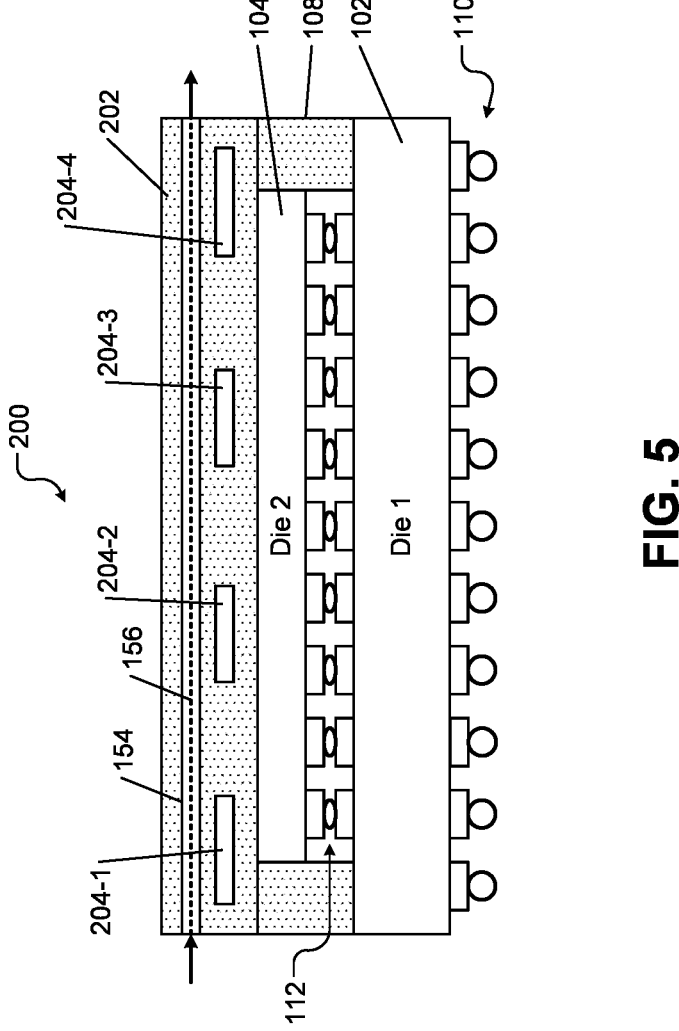
FIG. 5 shows a 3D IC of FIG. 2 with the carrier die further comprising circuits connectable to the dies in the 3D IC.

FIG. 5 schematically shows a cross-sectional view of an example of a 3D IC 200 according to the present disclosure. The 3D IC 200 comprises a carrier die 202 that comprises the microchannels 154. Additionally, the carrier die 202 comprises a plurality of circuits 204-1, 204-2, 204-3, 204-4 (individually called the circuit 204 and collectively called the circuits 204). While four circuits 204 are shown for example, the carrier die 202 may comprise one or more circuits 204. Nonlimiting examples of the circuits 204 comprise passive electrical components such as resistors, capacitors, and inductors; active electrical components such as transistors and diodes; and other circuits such as amplifiers and power regulators. Elements identified in FIG. 5 with the same reference numerals as in FIGS. 1 and 2 are not described again for brevity.

The microchannels 154 in the carrier die 202 are arranged around the circuits 204. For example, the microchannels 154 and the circuits 204 may be coplanar (i.e., arranged along a single horizontal plane parallel to the first and second dies 102, 104) in the carrier die 202. Alternatively, the microchannels 154 and the circuits 204 may be arranged in two separate planes in the carrier die 202. For example, the microchannels 154 may be arranged in a plane above and the circuits 204 in the carrier die 202. Alternatively, the microchannels 154 may be arranged in a plane below and the circuits 204 in the carrier die 202. In still other configurations, the circuits 204 may be arranged in different planes in the carrier die 202, and the microchannels 154 may be arranged around the circuits 204 in the different planes in the carrier die 202. Various non-limiting examples of arrangements of the microchannels 154 and the circuits 204 are shown in FIGS. 6A-6D and 7A-7D.

FIGS. 6A-6D and 7A-7H show transverse sections of the carrier die 202 of the 3D IC 200 shown in FIG. 5. The coolant 156 is not shown. As shown in FIGS. 3A-3D and 4A-4H, the configurations of the microchannels 154 shown in FIGS. 6A-6D and 7A-7H may also be based on patterns of heat distribution in the carrier die 202. In other words, the configurations and layouts of the microchannels 154 in the carrier die 202 can be patterned based on the type of circuitry in the first and second die 102, 104. Further, as shown in FIGS. 3A-3D, in FIGS. 6A-6D, each microchannel 154 comprises an inlet and an outlet to flow the coolant 156 through the microchannel 154. In other words, the coolant 156 flows through each of the microchannels 154 independently of the other microchannels 154.

Figures 6A, 6B, 6C, 6D:
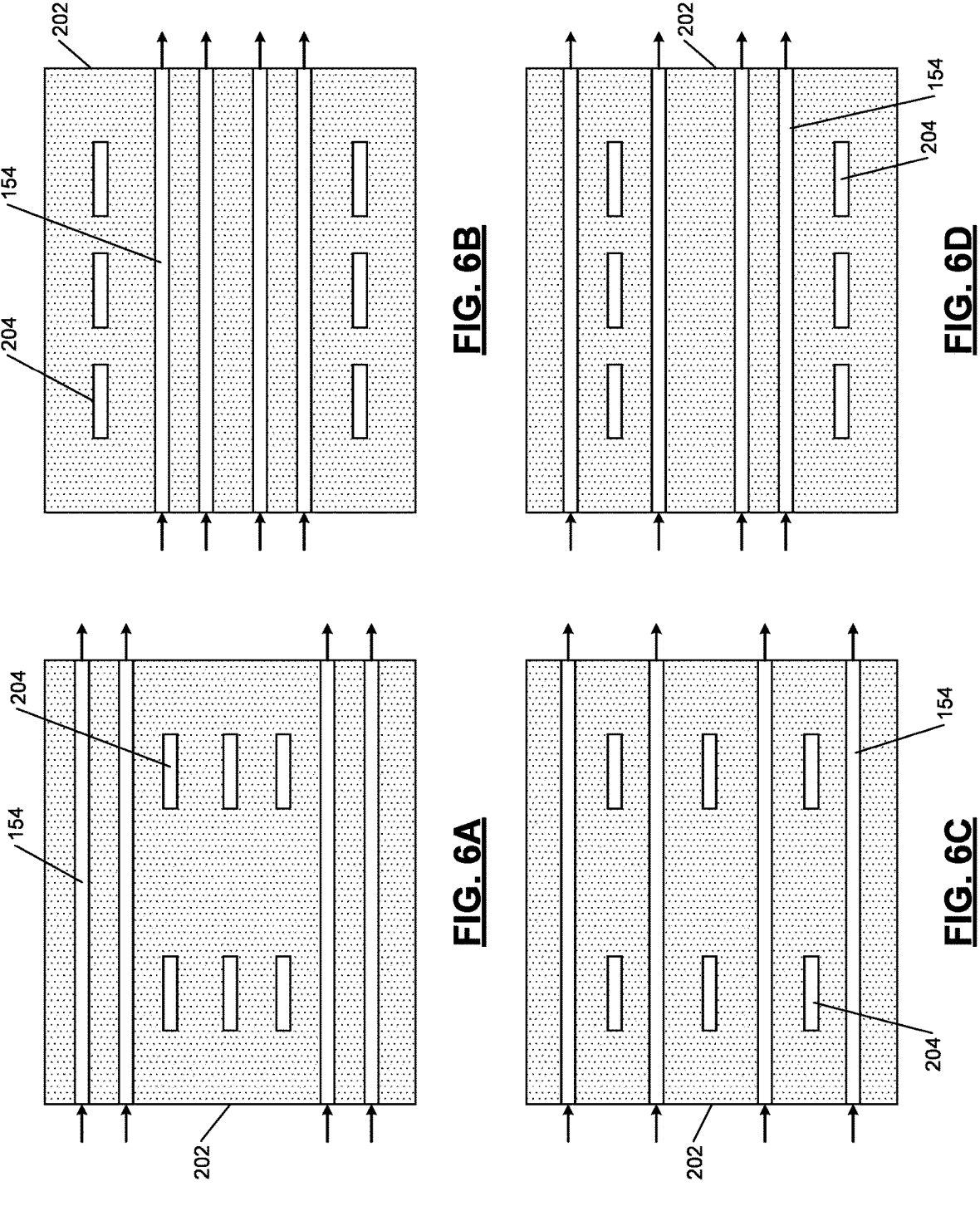
FIGS. 6A-6D and 7A-7H show various configurations and layouts of microchannels and circuits disposed in the carrier die in the 3D IC of FIG. 5.

For example, in FIG. 6A, a plurality of microchannels 154 may be disposed in the carrier die 202 adjacent to two sides of the carrier die 202 with no microchannels 154 disposed in a center region of the carrier die 202. The circuits 204 may be disposed in the center region of the carrier die 202. In FIG. 6B, a plurality of microchannels 154 may be disposed in the center region of the carrier die 202 with no microchannels 154 disposed adjacent to the sides of the carrier die 202. The circuits 204 may be disposed in the carrier die 202 adjacent to the sides of the carrier die 202.

In FIG. 6C, the microchannels 154 may be distributed evenly throughout the carrier die 202. The circuits 204 may also be disposed evenly throughout the carrier die 202. For example, the circuits 204 may be disposed in different rows. Each row of the circuits 204 may be disposed between two adjacent microchannels 154.

In FIG. 6D, some of the microchannels 154 may be disposed farther apart from one another in a first region of the carrier die 202 while other microchannels 154 may be disposed closer together in a second region of the carrier die 202. The circuits 204 may be disposed in rows. One row of the circuits 204 may be disposed between the microchannels 154 that are farther apart from each another in the first region of the carrier die 202. Another row of the circuits 204 may be disposed adjacent to the microchannels 154 that are closer together in the second region of the carrier die 202. Many other configurations of arranging the microchannels 154 and the circuits 204 in the carrier die 202 are possible. For example, any combination of the configurations shown in FIG. 6A-6D may be used.

FIGS. 7A-7H show non-limiting examples of configurations of the microchannels 154 in which one or more of the microchannels 154 may be connected to each other to form serpentine microchannels 154. For example, in FIG. 7A, a plurality of microchannels 154 may be disposed in the carrier die 202 adjacent to two sides of the carrier die 202 with no microchannels 154 disposed in the center region of the carrier die 202 similar to the configuration shown in FIG. 6A, except that in each pair of microchannels 154, the microchannels 154 are connected to each other. In each pair of connected microchannels 154, the coolant 156 flows through an inlet, flows through the pair of connected microchannels 154, and flows through an outlet. The circuits 204 may be disposed in the center region of the carrier die 202 with the connected microchannels 154 surrounding the circuits 204.

Figures 7A, 7B, 7C, 7D:
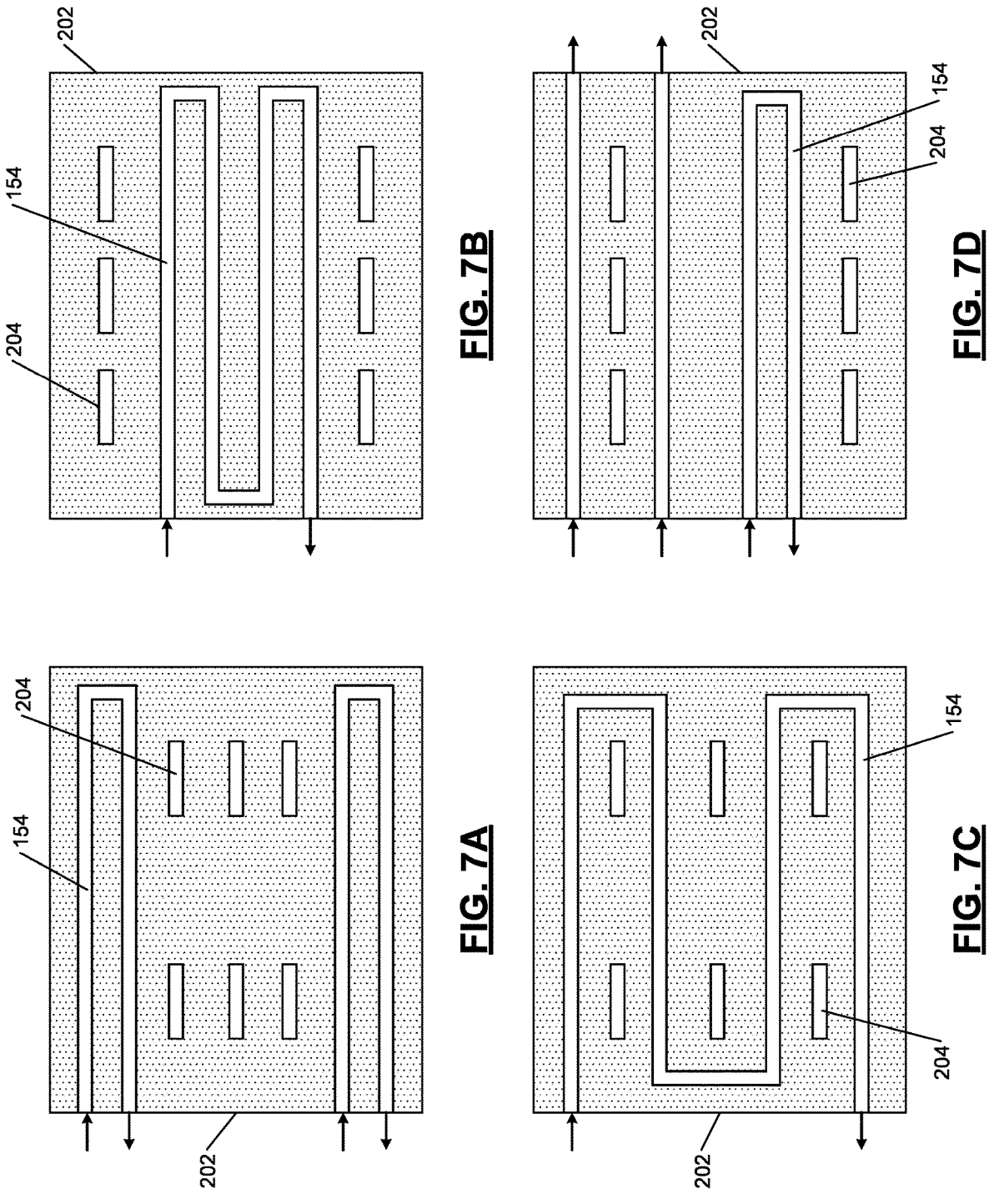
Figures 7E, 7F, 7G, 7H:
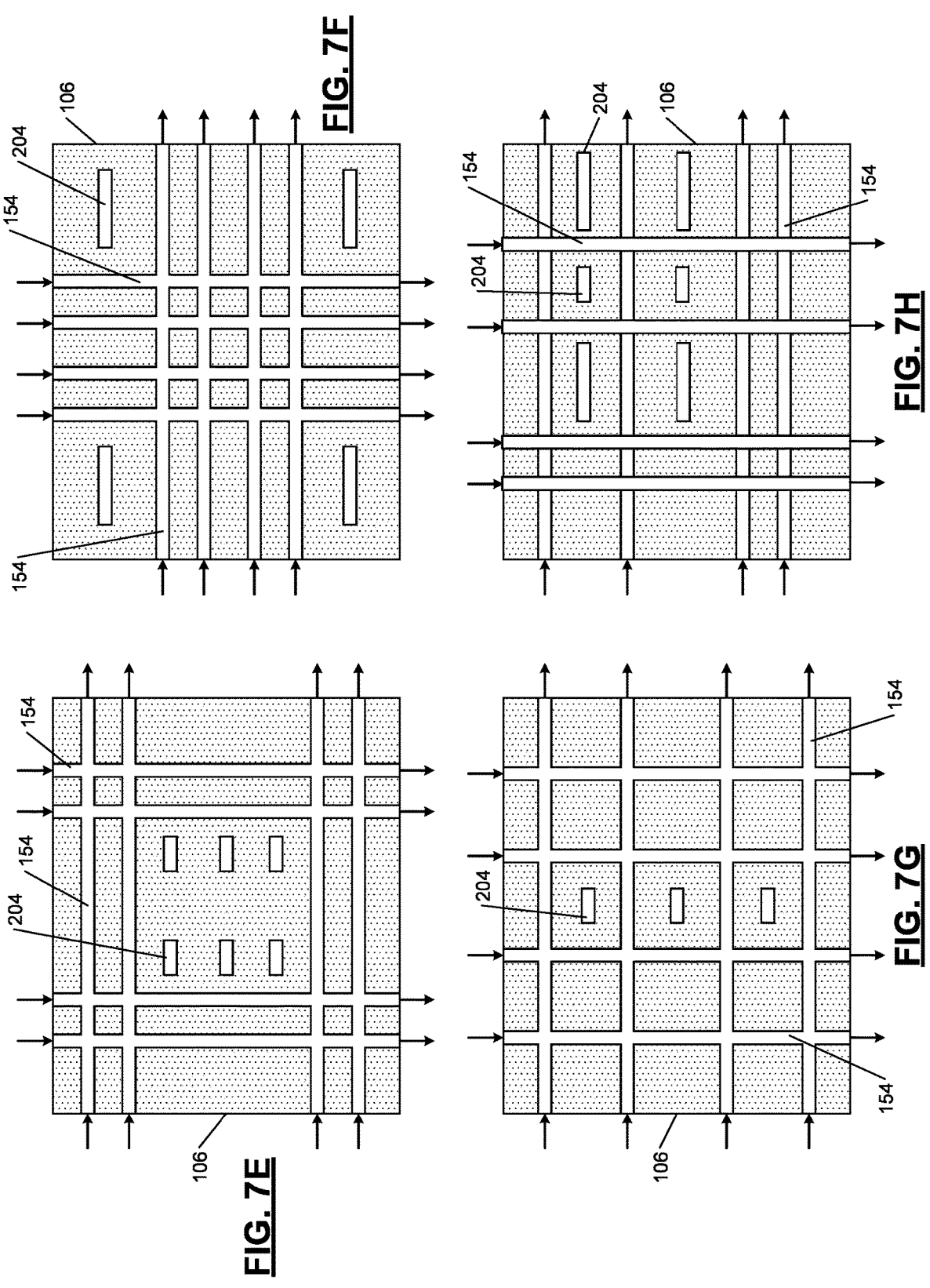

In FIG. 7B, a plurality of microchannels 154 may be disposed in the center region of the carrier die 202 with no microchannels 154 disposed adjacent to the sides of the carrier die 202 similar to the configuration shown in FIG. 6B, except that the microchannels 154 are connected to each other to form a serpentine microchannel 154. The coolant 156 flows through an inlet, flows through the serpentine microchannel 154, and flows through an outlet. The circuits 204 may be disposed adjacent to the sides of the carrier die 202 around the serpentine microchannel 154.

In FIG. 7C, the microchannels 154 may be distributed evenly throughout the carrier die 202 similar to the configuration shown in FIG. 6C, except that the microchannels 154 are connected to each other to form a serpentine microchannel 154. The coolant 156 flows through an inlet, flows through the serpentine microchannel 154, and flows through an outlet. Each row comprising some of the circuits 204 may be disposed between two adjacent segments of the serpentine microchannel 154.

In FIG. 7D, some of the microchannels 154 may be disposed farther apart from one another in a first region of the carrier die 106 while other microchannels 154 may be disposed closer together in a second region of the carrier die 106. In the example shown, the microchannels 154 in the first region are not connected to each other while the microchannels 154 in the second region are connected to each other. Alternatively, the microchannels 154 in the first region may be connected to each other while the microchannels 154 in the second region may not be connected to each other. In still other examples, the microchannels 154 in the first and second regions may be connected to each other. One row of the circuits 204 may be disposed between the microchannels 154 that are farther apart from each another in the first region of the carrier die 202. Another row of the circuits 204 may be disposed adjacent to the microchannels 154 that are closer together in the second region of the carrier die 202. Many other configurations of arranging and connecting the microchannels 154 in the carrier die 202 and arranging the circuits 204 in the carrier die 202 are possible. For example, any combination of the configurations shown in FIGS. 6A-6D and 7A-7D may be used.

FIGS. 7E-7H show the layouts of microchannels 154 shown in FIGS. 4E-4H along with non-limiting examples of layouts in which the circuits 204 may be disposed in the carrier die 204. The circuits 204 may be disposed in the carrier die 204 in other ways. The description of the microchannels 154 show in FIGS. 4E-4H applies equally to the microchannels 154 shown in FIGS. 7E-7H and is therefore not repeated for brevity.

FIGS. 8-11 show different ways of connecting the circuits 204 in the carrier die 202 to the first and second dies 102, 104 and to other circuits arranged on a PCB 220 on which the 3D IC 200 is mounted. FIGS. 8-11 schematically show cross-sectional views of the 3D IC 200 and the PCB 220 along with various TSVs. It is understood that depending on circuitry, numerous TSVs may be utilized to achieve the connections described below. The microchannels 154 disposed in the carrier die 202 of the 3D IC 200 can provide cooling for the 3D IC 200 as described above. Additionally, the circuits 204 disposed in the carrier die 202 of the 3D IC 200 can also make the 3D IC 200 and the PCB 220 compact as described below.

Figure 8:
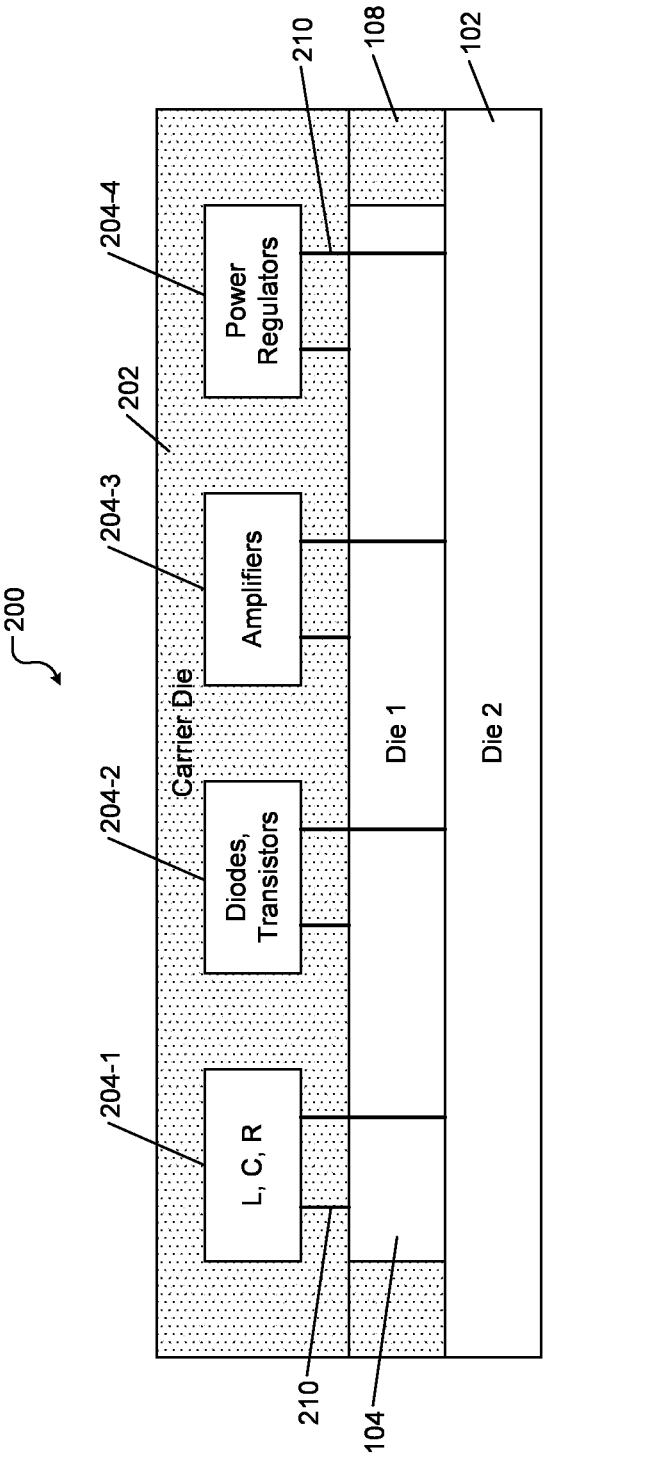
FIGS. 8-11 show various ways of connecting the circuits disposed in the carrier die in the 3D IC of FIG. 5 to the dies in the 3D IC and to a printed circuit board (PCB) comprising the 3D IC and other circuits.

FIG. 8 shows that the circuits 204 in the carrier die 202 can be connected to the first and second dies 102, 104 by TSVs 210 disposed in the carrier die 202 and in the first and second dies 102, 104. For example, some circuits in the first and second dies 102, 104 can use passive electrical components, active electrical components, amplifiers, and/or power regulators provided in the circuits 204 in the carrier die 202. By making use of the components provided in the circuits 204, the design and chip area of the first and second dies 102, 104 can be simplified and can be made compact.

Figure 9:
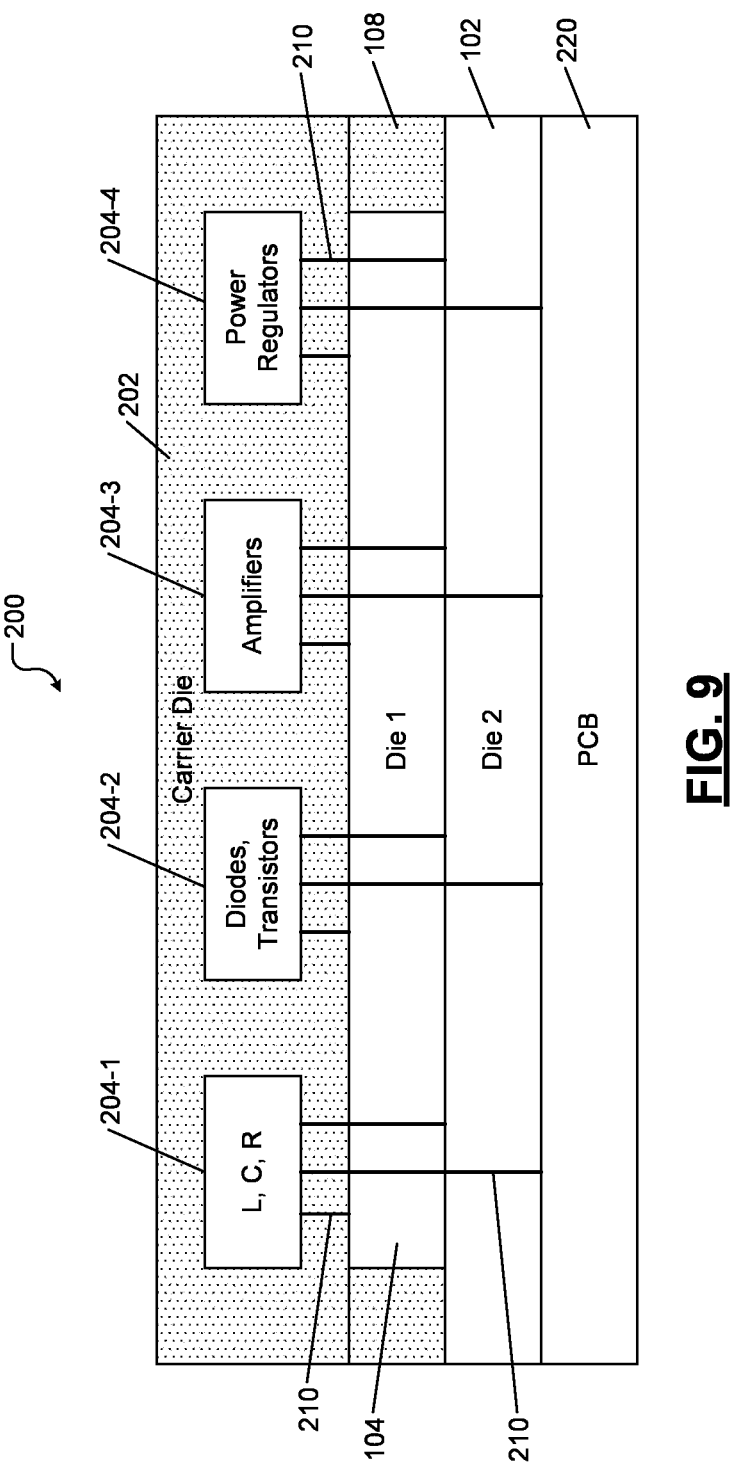

FIG. 9 shows that the 3D IC 200 is disposed on the PCB 220 and that the circuits 204 in the carrier die 202 can be connected to the first and second dies 102, 104 and to the PCB 220 by TSVs 210 disposed in each of the carrier die 202, the first and second dies 102, 104, and the PCB 220. For example, some circuits in the first and second dies 102, 104 and on the PCB 220 can use passive electrical components, active electrical components, amplifiers, and/or power regulators provided in the circuits 204 in the carrier die 202.

By making use of the components provided in the circuits 204, the design and chip area of the first and second dies 102, 104 can be simplified and can be made compact. Further, by making use of the components provided in the circuits 204, the design of the other circuits (examples shown at 222 in FIG. 11) on the PCB 220 can be simplified and the size of the PCB 220 can also be reduced. In other words, the circuits 204 in the carrier die 202 augment the circuitry in the first and second dies 102, 104 as well as circuitry on the PCB 220.

Figure 10:
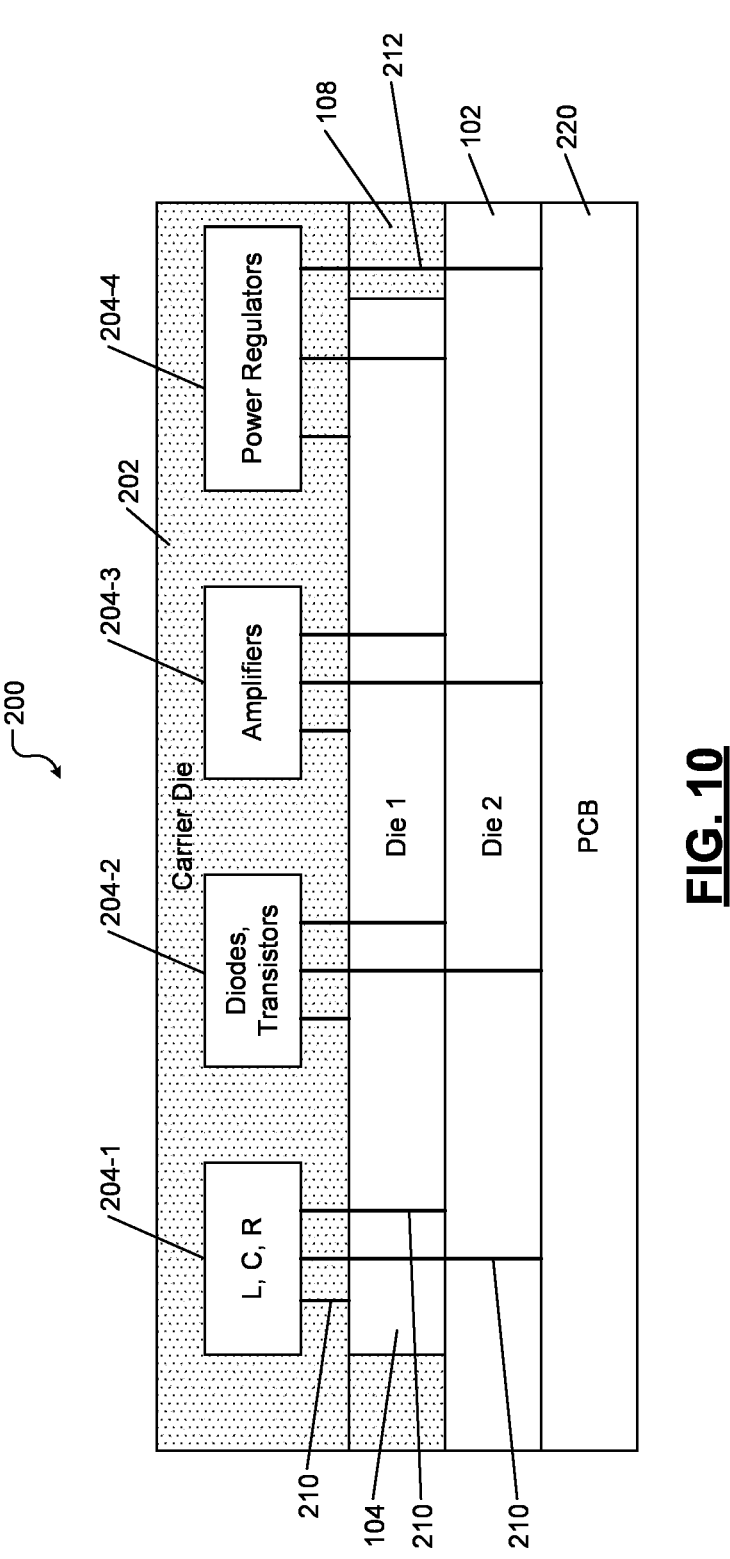

FIG. 10 shows that at least one of the circuits 204 in the carrier die 202 may be connected to the second die 104 and the PCB 220 by TSVs 212 disposed in each of the carrier die 202, the silicon block 108, the second die 104, and the PCB 220. The connections can provide benefits similar to those described above with reference to FIG. 9. While TSVs 212 are shown only in one portion of the carrier die 202 and the silicon block 108, the TSVs 212 can also be disposed in other portions of the carrier die 202 and the silicon block 108. Furthermore, the TSVs 212 can be in addition to the TSVs 210 shown in FIG. 9.

Figure 11:
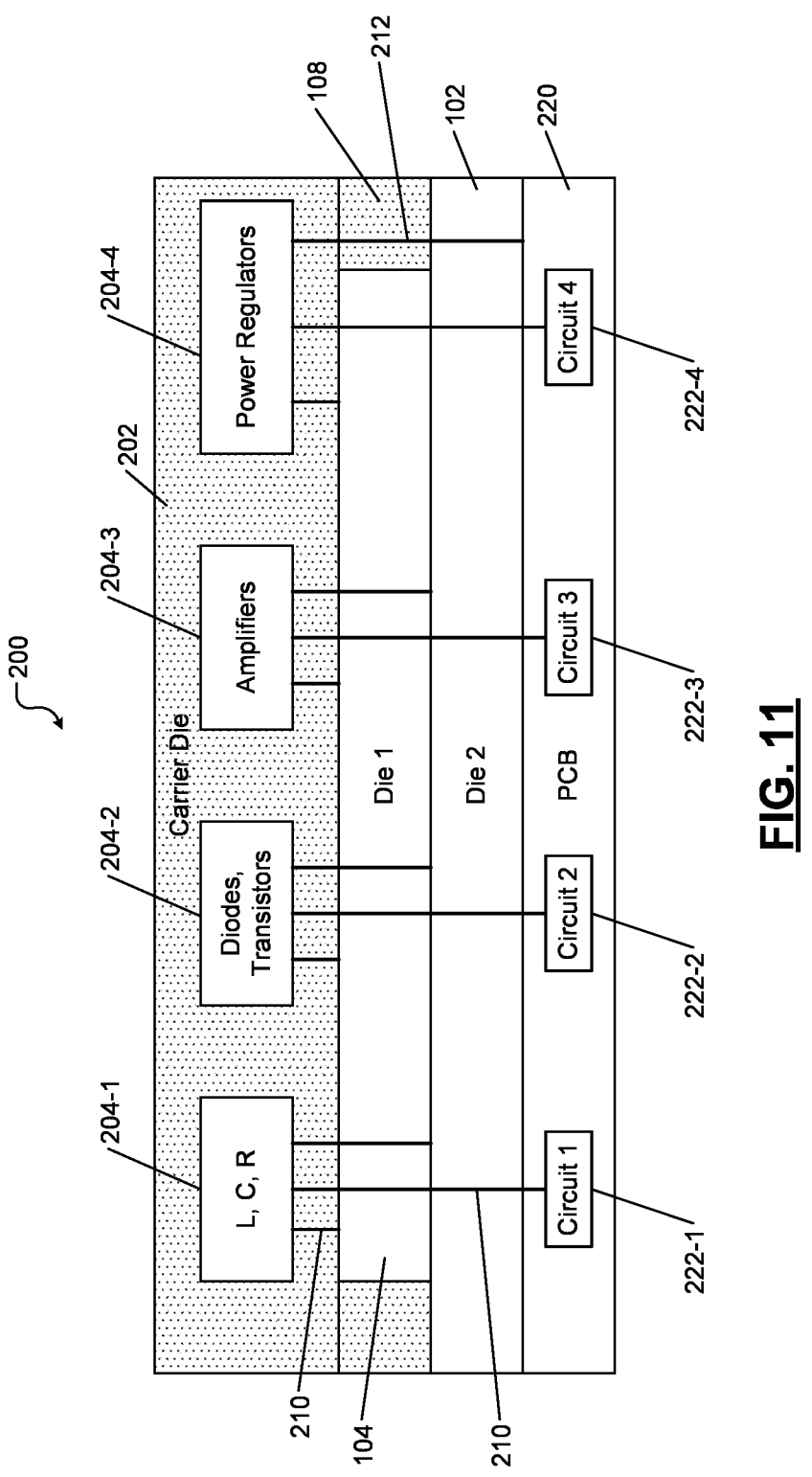

FIG. 11 shows that the PCB 220 comprises one or more circuits such as Circuit 1 shown at 222-1, Circuit 2 shown at 222-2, Circuit 3 shown at 222-3, and Circuit 4 shown at 222-4 (individually called the circuit 222 and collectively called the circuits 222). One or more of the circuits 222 disposed on the PCB 220 can utilize one or more of the circuits 204 disposed in the carrier die 202. The connections can provide benefits similar to those described above with reference to FIG. 9.

For example, the design of some of the circuits 222 on the PCB 220 can be simplified by removing some components from the circuits 222 to one or more of the circuits 204 disposed in the carrier die 202. For example, the PCB 220 may typically comprise a power regulator used to regulate power supplied to the first and second dies 102, 104 in the 3D IC 200 and power supplied to the other circuits 222 disposed on the PCB 220.

Instead, the power regulator can be removed from the PCB 220 to one of the circuits 204 in the carrier die 202. The power regulator disposed in one of the circuits 204 in the carrier die 202 can be connected to a power supply bus bar on the PCB 220 to receive power from the PCB 220. The power regulator disposed in one of the circuits 204 in the carrier die 202 can regulate power supplied to the first and second dies 102, 104 in the 3D IC 200 and power supplied to the other circuits 222 disposed on the PCB 220. Thus, the circuits 222 disposed on the PCB 220 need not additionally include a power regulator.

Further, in some applications, the first and second dies 102, 104 in the 3D IC 200 and the circuits 222 disposed on the PCB 220 may utilize more than one power supply (e.g., ±5V, ±12V, etc.). A first power regulator disposed in one of the circuits 204 in the carrier die 202 can regulate a first power supply, and a second power regulator disposed in one of the circuits 222 on the PCB 220 can regulate a second power supply. Thus, power supply to the 3D IC 200 can be controlled from the top end of the 3D IC 200 using the first power regulator in one of the circuits 204 disposed in the carrier die 202 as well as from the bottom end of the 3D IC 200 using the second power regulator disposed in one of the circuits 222 on the PCB 220. Further, the microchannels 154 disposed in the carrier die 202 can provide cooling for the 3D IC 200 and the circuits 204 disposed in the carrier die 202 can make the 3D IC 200 and the PCB 220 compact.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between circuit elements, semiconductor layers, etc.) are described using various terms, including "connected," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

What is claimed is:

1. A three-dimensional (3D) integrated circuit (IC) comprising:
   a plurality of dies stacked in the 3D IC, each of the stacked dies comprising circuitry;
   a carrier die disposed above the stacked dies in the 3D IC, the carrier die configured to provide mechanical support to the stacked dies in the 3D IC, wherein the carrier die comprises one or more circuits connected to one or more of the stacked dies in the 3D IC by one or more vias in the carrier die and in the one or more of the stacked dies in the 3D IC; and
   a plurality of channels embedded in the carrier die, the plurality of channels configured to carry a coolant to cool the 3D IC.

2. The 3D IC of claim 1 wherein the plurality of channels is configured to carry a fluid coolant in a liquid or gaseous phase to remove heat from the stacked dies in the 3D IC.

3. The 3D IC of claim 1 wherein the channels in the plurality of channels are unconnected to each other.

4. The 3D IC of claim 1 wherein at least two of channels in the plurality of channels are connected to each other.

5. The 3D IC of claim 1 wherein the channels in the plurality of channels are distributed evenly throughout the carrier die.

6. The 3D IC of claim 1 wherein the channels in the plurality of channels are configured to provide a first cooling capacity at a first spatial region of the 3D IC and a second cooling capacity, different from the first cooling capacity, at a second spatial region of the 3D IC different from the first spatial region.

7. The 3D IC of claim 1 wherein the channels in the plurality of channels are distributed in one or more different patterns in the carrier die.

8. A system comprising the 3D IC of claim 1 and further comprising a coolant supply configured to supply the coolant to flow through the plurality of channels, the coolant configured to draw heat from the stacked dies in the 3D IC.

9. The 3D IC of claim 1 wherein the one or more circuits comprise at least one of (i) passive electrical components, (ii) active electrical components, (iii) an amplifier, and (iv) a power regulator.

10. The 3D IC of claim 9 wherein the passive electrical components comprise at least one of a resistor, a capacitor, and an inductor; and wherein the active electrical components comprise at least one of a transistor and a diode.

11. The 3D IC of claim 1 wherein the channels in the plurality of channels in the carrier die are disposed around the one or more circuits in the carrier die.

12. The 3D IC of claim 1 wherein the plurality of channels and the one or more circuits in the carrier die are disposed in a same plane.

13. The 3D IC of claim 1 wherein the plurality of channels and the one or more circuits in the carrier die are disposed in different planes.

14. The 3D IC of claim 1 further comprising a layer of silicon disposed around one of the stacked dies, wherein at least one of the one or more circuits is connected to the one or more of the stacked dies in the 3D IC by the one or more vias in the carrier die, the one or more of the stacked dies in the 3D IC, and the layer of silicon.

15. An electronic system comprising the 3D IC of claim 1 and further comprising a printed circuit board (PCB) on which the 3D IC is mounted, wherein the PCB comprises at least one circuit connected to at least one of the one or more the circuits in the carrier die.

16. The electronic system of claim 15 wherein the at least one circuit on the PCB is connected to the at least one of the one or more circuits in the carrier die by vias in the carrier die, the stacked dies in the 3D IC, and the PCB.

17. The electronic system of claim 15 further comprising a layer of silicon disposed around one of the stacked dies, wherein the at least one circuit on the PCB is connected to the at least one of the one or more circuits in the carrier die by vias in the carrier die, the stacked dies in the 3D IC, the PCB, and the layer of silicon.

18. The electronic system of claim 15 wherein:

the at least one circuit on the PCB comprises a first power regulator configured to regulate a first power supply configured to supply a first power to at least one of the stacked dies in the 3D IC; and the at least one of the one or more circuits in the carrier die comprises a second power regulator configured to regulate a second power supply configured to supply a second power to at least one of the stacked dies in the 3D IC.

19. The electronic system of claim 18 wherein the first and second power regulators are configured to regulate different voltages.

20. A method of fabricating a three-dimensional (3D) integrated circuit (IC) comprising:

arranging a plurality of dies in a stack, each of the stacked dies comprising circuitry;

disposing a carrier die above the stacked dies to provide mechanical support to the stacked dies;

disposing one or more circuits in the carrier die;

connecting the one or more circuits to one or more of the stacked dies by one or more vias in the carrier die and in the one or more of the stacked dies;

embedding a plurality of channels in the carrier die; and supplying a coolant through the plurality of channels to cool the 3D IC.

21. The method of claim 20 further comprising embedding the plurality of channels in the carrier die by orthogonally disposing the plurality of channels in the carrier die using at least one of drilling and etching processes.

22. The method of claim 20 further comprising providing a first cooling capacity at a first spatial region of the 3D IC and a second cooling capacity, different from the first cooling capacity, at a second spatial region of the 3D IC different from the first spatial region.

23. The method of claim 20 further comprising arranging the plurality of channels and the one or more circuits in the carrier die in respective planes.

24. The method of claim 20 further comprising disposing the plurality of channels in the carrier die around the one or more circuits in the carrier die.

25. The method of claim 20 further comprising:

disposing a layer of silicon disposed around one of the stacked dies; and connecting at least one of the one or more circuits to one or more of the stacked dies by the one or more vias in the carrier die, the one or more of the stacked dies in the 3D IC, and the layer of silicon.

26. The method of claim 20 further comprising:

mounting the 3D IC on a printed circuit board (PCB) comprising at least one circuit; and connecting the at least one circuit on the PCB to at least one of the one or more circuits in the carrier die.

27. The method of claim 26 further comprising:

disposing a layer of silicon around one of the stacked dies; and connecting the at least one circuit on the PCB to at least one of the one or more circuits in the carrier die by vias in the carrier die, the stacked dies in the 3D IC, the PCB, and the layer of silicon.

28. The method of claim 26 further comprising:

regulating a first power supply configured to supply a first power to at least one of the stacked dies using a first power regulator disposed in the at least one circuit on the PCB; and regulating a second power supply configured to supply a second power to at least one of the stacked dies using a second power regulator disposed in at least one of the one or more circuits in the carrier die.

* * * * *